United States Patent [19]
Sempel

[11] Patent Number: 5,017,890
[45] Date of Patent: May 21, 1991

[54] PHASE-CONTROLLABLE OSCILLATOR

[75] Inventor: Adrianus Sempel, Eindhoven, Netherlands

[73] Assignee: U.S. Philips Corporation, New York, N.Y.

[21] Appl. No.: 468,500

[22] Filed: Jan. 23, 1990

[30] Foreign Application Priority Data

Jan. 27, 1989 [NL] Netherlands ............ 8900203

[51] Int. Cl.$^5$ ............ H03K 3/282; H03B 27/00
[52] U.S. Cl. ............ 331/45; 331/61; 331/75; 331/113 R; 331/144
[58] Field of Search ............ 331/45, 60, 61, 74, 331/75, 113 R, 111, 144, 143

[56] References Cited

U.S. PATENT DOCUMENTS 4,563,597 1/1986 Betzold ............ 307/360

FOREIGN PATENT DOCUMENTS 3327427 2/1985 Fed. Rep. of Germany ... 331/113 R

OTHER PUBLICATIONS

Ballatore, "Precision Phase Shifter", IBM Technical Disclosure Bulletin, vol. 23; No. 10, Mar. 1981, pp. 4513-4514.

Primary Examiner—Siegfried H. Grimm
Attorney, Agent, or Firm—Bernard Franzblau

[57] ABSTRACT

A phase-controllable oscillator consists of a capacitance and an apparatus for charging and an apparatus for discharging the capacitance. In addition, feedback is provided for activating the charging and discharging apparatus in dependence on the oscillator signal. An amplifier for amplifying the capacitance voltage can be phase-controlled by providing the amplifier with a control input for adjusting the phase difference between a zero-crossing of an amplifier output signal on the one hand and a reference phase in the oscillator signal on the other hand. In order to maintain the duty cycle, a switching apparatus is provided for reversing the polarity of the control input under the control of the oscillator signal.

17 Claims, 3 Drawing Sheets

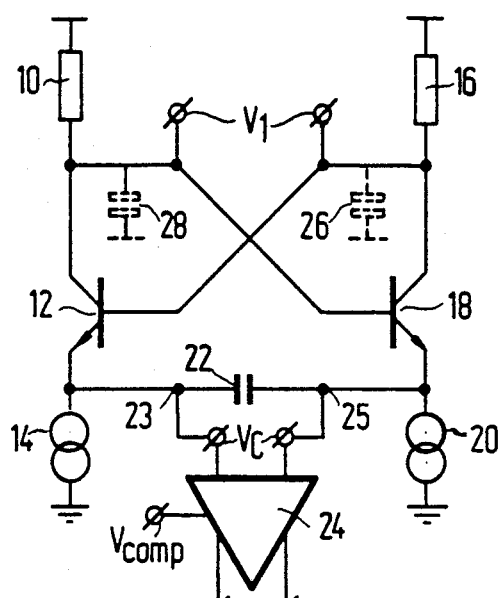
FIG. 1
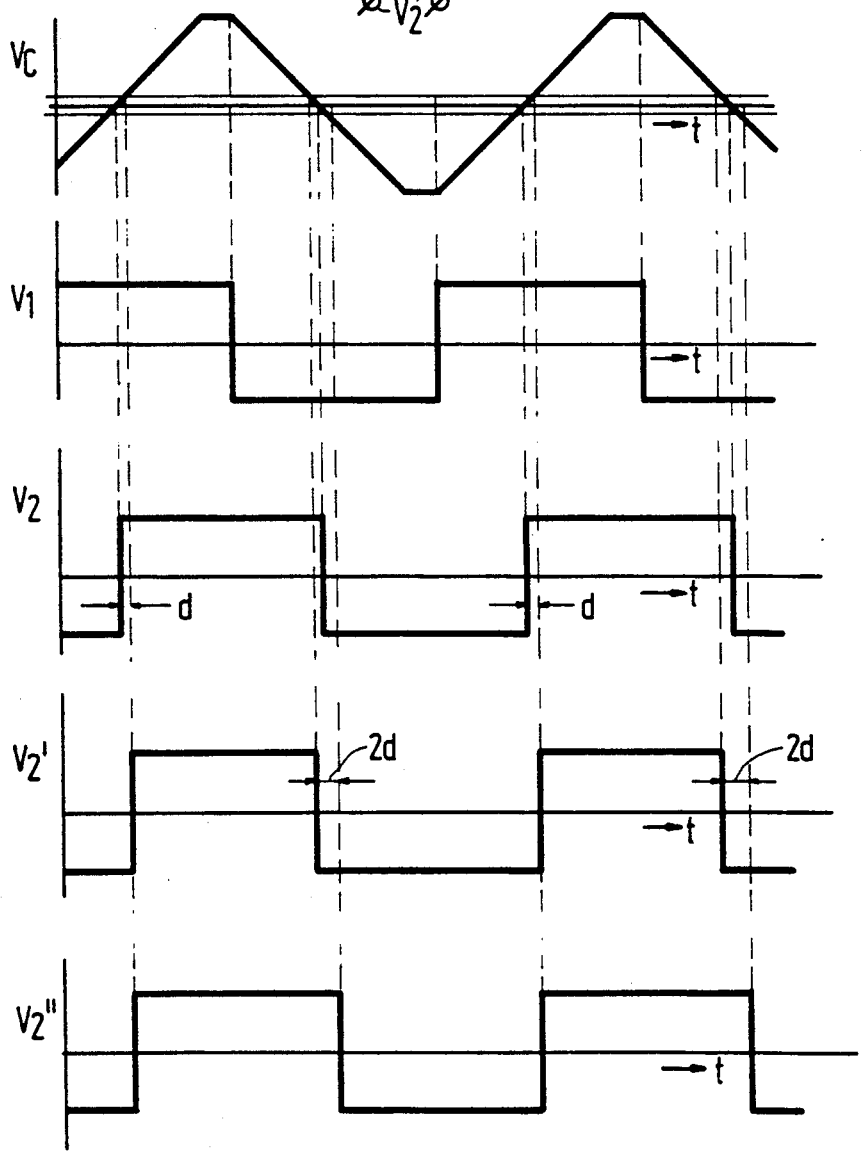
FIG. 2A
FIG. 2B
FIG. 2C
FIG. 2D
FIG. 2E

PHASE-CONTROLLABLE OSCILLATOR

BACKGROUND OF THE INVENTION

This invention relates to an oscillator, comprising a capacitance, charging means and discharging means for charging and discharging the capacitance, respectively, feedback means for activating the charging means and discharging means in dependence on an oscillator signal, and an amplifier for amplifying the capacitance voltage.

An oscillator of this kind is generally known, for example, as a multivibrator in the form of two cross-coupled inverter circuits, the capacitance being coupled between non-inverting outputs thereof. In order to generate two squarewave signals exhibiting a phase shift of 90°, a differential amplifier is connected across the capacitance. A first squarewave signal is available between inverting outputs of the inverter circuits, and a second squarewave signal is available on complementary outputs of the differential amplifier. A drawback of the known oscillator is that between the two squarewave signals a phase difference occurs which depends, for example, on the spread in technology-dependent parameters and on frequency-selective parasitic effects. These parasitic effects are more prominent as the oscillation frequency is higher.

It is a further drawback of the known oscillator that the phase difference is not controllable, for example in order to compensate for said disturbing effects.

SUMMARY OF THE INVENTION

Therefore, it is an object of the invention to provide an oscillator of the kind set forth in which the phase difference is adjustable so that, for example, compensation for said disturbing effects is possible.

To achieve this, an oscillator in accordance with the invention is characterized in that the amplifier comprises a control input for adjusting the phase difference between a zero-crossing of an amplifier output signal on the one hand and a reference phase in the oscillator signal on the other hand by means of an offset voltage. The phase difference between a zero-crossing of the squarewave signal on the differential amplifier output on the one hand and a reference phase in the oscillator signal on the other hand can be controlled by adjustment of the change-over point of the differential amplifier.

An embodiment of an oscillator in accordance with the invention is characterized in that it comprises switching means for reversing the polarity of the offset voltage at the control input under the control of the oscillator signal. As a result of the reversal of the polarity of the offset voltage, the duty cycle of the squarewave signal on the differential amplifier output remains constant.

A further embodiment of an oscillator in accordance with the invention is characterized in that there is provided a control loop which comprises a phase difference detector for generating the offset voltage for the control input in dependence on the oscillator signal and the amplifier output signal. Using the control loop, the phase difference between the oscillator signal on the one hand and the amplifier output signal on the other hand can be maintained at a predetermined, constant value.

BRIEF DESCRIPTION OF THE DRAWINGS

The invention will be described in detail hereinafter with reference to the accompanying drawing; in which FIG. 1 shows an example of a multivibrator in accordance with the invention, FIGS. 2A to 2E illustrate the variation of various signals in the multivibrator shown in FIG. 1, FIGS. 3, 4 and 5 show examples of controllable differential amplifiers for use in a multivibrator as shown in FIG. 1.

DESCRIPTION OF THE PREFERRED EMBODIMENTS

Figure 3:
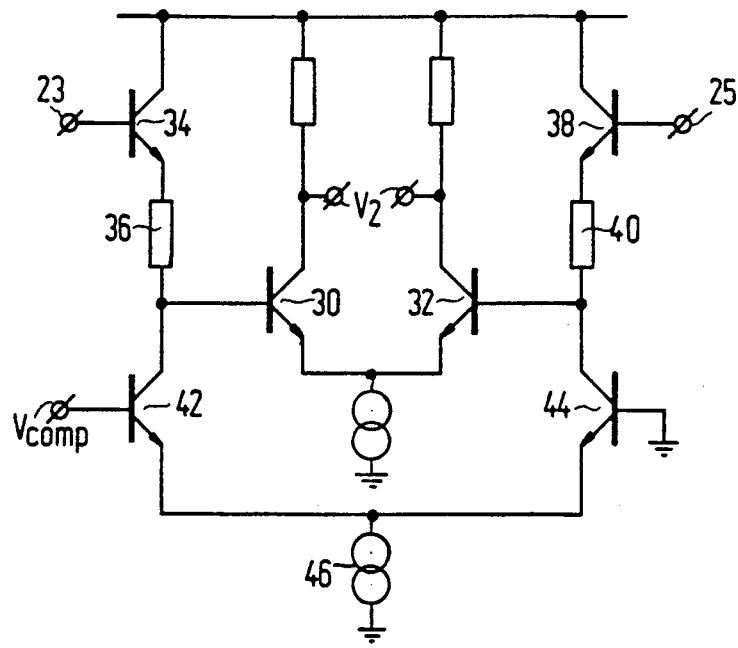

FIG. 1 diagrammatically shows a multivibrator circuit in accordance with the invention. The multivibrator comprises a first inverter circuit consisting of a series connection of a resistance 10, a current channel of a transistor 12 and a current source 14, and a second inverter circuit which includes a series connection of a resistance 16, a current channel of a transistor 18, and a current source 20. The inverting outputs of the inverter circuits are cross-wise connected to their inputs. The non-inverting outputs 23 and 25 are interconnected via a capacitance 22. A differential amplifier 24 is connected across the capacitance 22. In the ideal case a sawtooth voltage $V_c$ exists across the capacitance, which sawtooth voltage is converted into a squarewave voltage $V_2$ by the amplifier 24, a phase difference of 90° existing between said squarewave voltage $V_2$ and the squarewave voltage $V_1$ developed between the inverting outputs. However, because of the presence of disturbing effects, for example in the form of parasitic capacitances 26 and 28, delays occur in the switching of the transistors. This can be understood as follows. By way of example a situation is assumed where the transistor 12 is turned on and the transistor 18 is turned off. The voltage on the emitter of the transistor 12 increases because the transistor 12 applies more current to the capacitance 22 than is drained by the current source 14. The voltage on the emitter of the transistor 18 decreases due to the discharging of the capacitance 22 by the current source 20. When the emitter voltage of the transistor 18 has decreased below its base voltage so far that the transistor 18 is turned on, said discharging ceases. Upon the transition from the turned-off state to the turned-on state of the transitor 18, at the same time a transition from the turned-on state to the turned-off state of the transistor 12 would occur were it not for the fact that the parasitic capacitance 26 still retains a charge, thus introducing a delay into the operation. Because of this delay there is a period of time, indicative of the magnitude of the parasitic capacitance 26, during which both transistors 12 and 18 are turned on. The voltages on the nodes 23 and 25 then increase to the same extent so that the voltage $V_c$ across the capacitance 22 remains substantially constant during said period of time. However, as soon as the parasitic capacitance 26 has been discharged so far that the base-emitter voltage of the transistor 12 drops below the switching threshold, the transistor 12 is turned off so that the voltage $V_c$ changes under the influence of the current source 14. FIG. 2A shows this voltage $V_c$ as a function of time. Between successive edges of the sawtooth voltage $V_c$ there is a period of time during which the capacitance voltage remains substantially constant, as described above.

FIG. 2B shows the output voltage $V_1$. The transitions in the squarewave signal $V_1$ relate to the instants at which the relevant parasitic capacitance 26 or 28 is discharged and the transistor 12 or 18 is turned off. The delay effect, therefore, also becomes manifest in the output voltage $V_1$.

FIG. 2C shows the uncorrected output signal $V_2$ of the amplifier 24. This squarewave signal $V_2$ exhibits transitions between two logic states at the instant at which the capacitance voltage is substantially zero, subject to the condition that the offset voltage $V_{comp}$ of the amplifier 24 is zero. The phase relationship between the squarewave signal $V_1$ and the uncorrected output signal $V_2$ no longer amounts to 90° because of the delay incurred by the first squarewave signal $V_1$. The deviation from said 90° is denoted by the reference d in the drawing. In order to restore the phase difference between the transitions from logic low to logic high of the squarewave signals $V_1$ and $V_2$, it would be necessary to delay the output signal $V_2$ in conformity with the deviation d. This is possible by adjusting the change-over point of the comparator 24 so that it is no longer equal to zero, but to a compensation voltage $V_{comp}$ (offset) unequal to zero. This is denoted in FIG. 2D by way of the output voltage $V_2'$. Said transitions from logic low to logic high again exhibit a phase difference of 90° with respect to one another. A side effect of the adjustment of the compensation value consists in that the duty cycle of $V_2'$ changes because the transition from logic high to logic low in the signal $V_2'$ occurs prior to the zero-crossing of the capacitance voltage $V_c$. When the negative-going edge in the signal $V_2'$ is shifted over a distance 2d as shown in FIG. 2E, the signal $V_2''$ is obtained. In order to realize this shift, the compensation voltage $V_{comp}$ should be periodically switched between positive and negative values.

Figure 4:
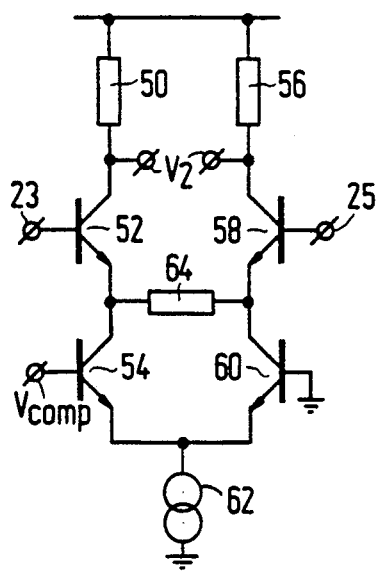
Figure 5:
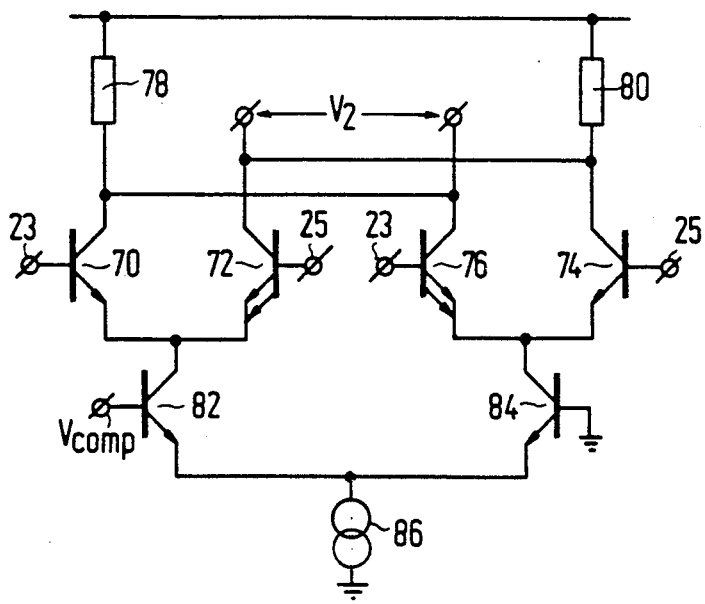

FIGS. 3, 4 and 5 show some alternative embodiments of differential amplifiers which have a controllable change-over point and which are suitable for cooperation with a multivibrator of the described type. The controllable differential amplifier shown in FIG. 3 comprises a differential amplifier transistor pair which includes transistors 30 and 32. A control electrode of the transistor 30 is connected to a first current branch which includes a transistor 34, a resistance 36 and a transistor 42. A control electrode of the transistor 32 is connected to a second current branch which includes a transistor 38, a resistance 40 and a transistor 44. In conjunction with a current source 46 the transistors 42 and 44 consitute current sources which can be controlled in a mutually complementary fashion by the compensation voltage $V_{comp}$. The control electrodes of the transistors 34 and 38 are connected to the nodes 23 and 25 in FIG. 1. At the change-over point of this differential amplifier the control voltages of the transistors 30 and 32 are equal. In the case of unequal currents in the current branches, adjusted by means of the compensation voltage $V_{comp}$, the voltage drop across the resistances 36 and 40 (chosen to be identical in the present example) is also different. Assuming that the turned-on transistors 34 and 38 then have a control voltage of approximately 0.7 V, it follows that the input voltages for the transistors 34 and 38 are unequal. Therefore, the change-over point occurs for a capacitance voltage unequal to zero. The polarity reversal of the compensation voltage $V_{comp}$ will be described in detail hereinafter.

The controllable differential amplifier shown in FIG. 4 comprises a first current branch with a series connection of a load 50, a transistor 52 and a transistor 54, and also comprises a second current branch consisting of a series connection of a load 56, a transistor 58 and a transistor 60. The current branches are fed by a current source 62. The current branches are interconnected via a resistance 64 at the area of nodes between the transistors in each of the branches. The control electrodes of the transistors 52 and 58 are connected to the nodes 23 and 25, i.e. across the capacitance 22 (FIG. 1). The control electrode of at least the transistor 54 or the transistor 60 constitutes a control input for the compensation signal. The outputs of the differential amplifier are formed by a node in each branch between the load 50 or the load 56 and the transistor 52 or the transistor 58, respectively.

At the change-over point of this differential amplifier the currents through the loads 50 and 56 are equal, subject to the condition that the loads are identical. This implies that the base-emitter voltages of the transistors 52 and 58 are then equal. The difference between the emitter voltages of the transistors 52 and 58 is related to a compensation current through the resistance 64. The compensation current is equal to the current difference between the currents conducted by the transistor 52 and the transistor 54 as well as being equal to the current difference between the currents conducted by the transistor 58 and the transistor 60. This difference is adjustable by way of a voltage between the control electrodes of the transistors 54 and 60. Therefore, the emitter voltages of the transistors 52 and 58 being unequal for equal currents through the loads 50 and 56, the control voltages of the transistors 52 and 58 must also be different at the change-over point. The reversal of the polarity of the compensation voltage $V_{comp}$ will be described in detail hereinafter.

The controllable differential amplifier shown in FIG. 5 comprises a first transistor pair 70 and 72 in a differential amplifier configuration, and a second transistor pair comprising transisitors 74 and 76 in a differential amplifier configuration. Both differential amplifier configurations are connected to the same loads 78 and 80 and are fed in a complementary fashion by means of a third differential amplifier transistor pair 82 and 84. The latter transistor pair is fed by a current source 86. The first and the second transistor pairs have an asymmetrical construction. In the present example the transistors 72 and 76 are twice as large as the transistors 70 and 74. The control electrodes of the transistors 70 and 76 are connected to the node 23 of the capacitance 22; the control electrodes of the transistors 72 and 74 are connected to the node 25 of the capacitance 22. The transistor pair 82/84 is controlled by means of a compensation voltage $V_{comp}$ whereby the currents feeding the first and the second transistor pair are adjusted. The nodes between the resistances 78 and 80 and the transistor pairs constitute the output of the differential amplifier. At the change-over point of this differential amplifier the difference between the currents in the first transistor pair 70 and 72 equals the difference between the currents in the second transistor pair 76 and 74. For both transistor pairs this difference can be expressed in the same function F where the arguments are the capacitance voltage, the total current through the relevant transistor pair, and the ratio of the magnitudes of the relevant transistors. Because both asymmetrical transistor pairs themselves are driven in a mutually opposed manner, a nontrivial solution is obtained for the capacitance voltage where the output voltage $V_2$ is equal to zero below given currents through the transistors 82 and 84.

Figure 6:
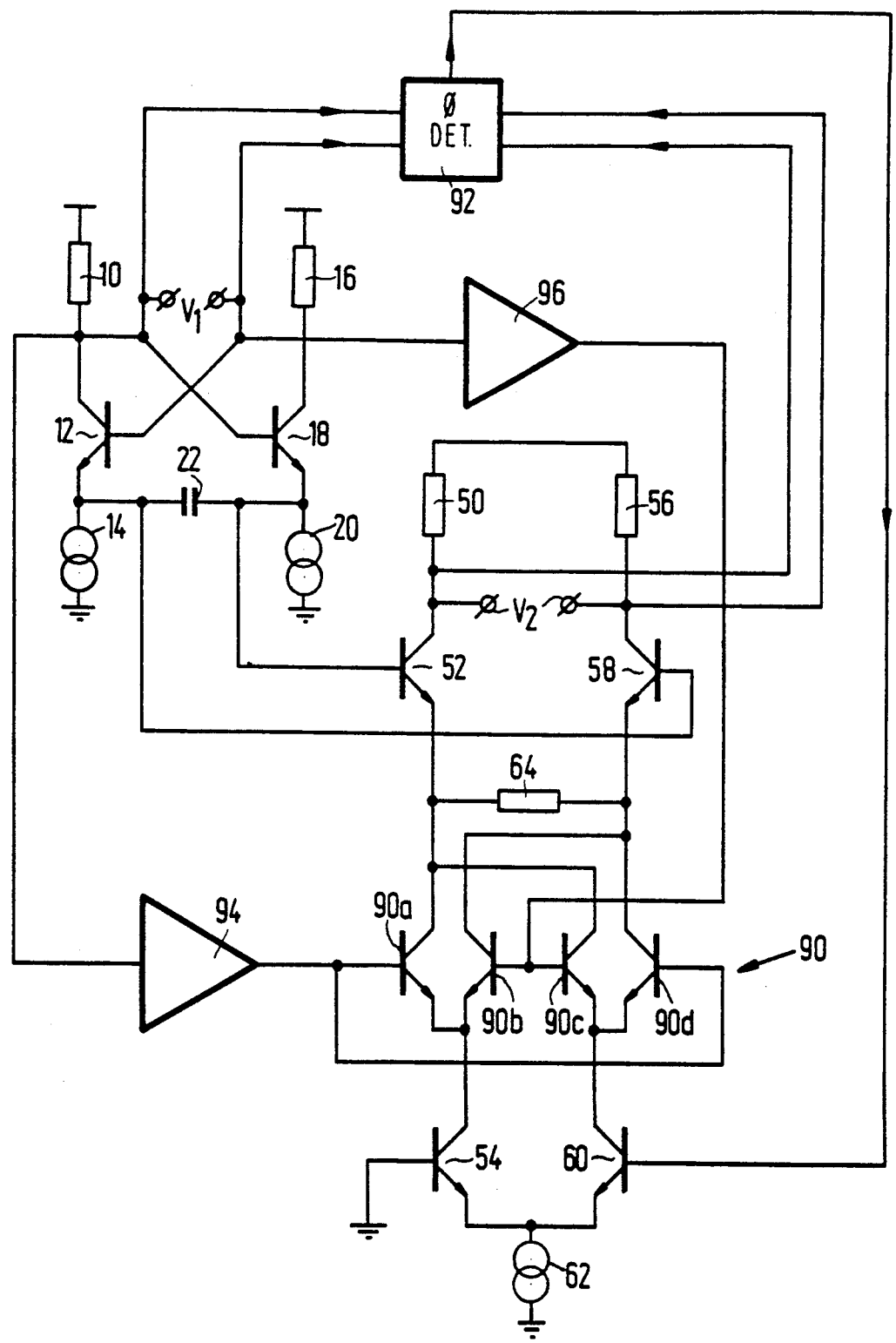
FIG. 6 shows a multivibrator circuit comprising a control loop and switching means for the periodic polarity reversal of the control signal.

FIG. 6 shows an example of a multivibrator circuit comprising a control loop and switching means for periodically reversing the polarity of the compensation voltage $V_{comp}$. The reference numerals 10 to 22 correspond to those of the multivibrator shown in FIG. 1. The reference numerals 50 to 62 correspond to those of the amplifier shown in FIG. 4. A polarity reversing circuit 90 has been added which, insynchronism with the signal $V_1$, reverses the effect of the transistor pair 54/60. In the present example the polarity reversing circuit 90 comprises two mutually parallel-connected transistor differential pairs 90a/b and 90c/d which are controlled by the signal $V_1$ in a mutually opposed manner. In order to provide amplification and a level shift, buffers 94 and 96 are arranged between the multivibrator comprising the components 10 to 20 and the polarity reversing circuit 90. The squarewave signal $V_1$ is applied to a phase detector 92. The output signal $V_2$ of the amplifier comprising the components 50 to 62 is also applied to the phase detector 92. The phase detector comprises, for example, a multiplier as known, for example from "Analysis and Design of Analog Integrated Circuits", Sec. Ed., P. Gray and R. Meyer, 1984, p. 603. The phase detector detects the phase difference and controls the value of the compensation signal applied to the transistor 60 so that the phase difference between the squarewave signals $V_1$ and $V_2$ is maintained at a predetermined value, for example, 90°.

It is to be noted that the circuits shown by way of example in the described Figures comprise bipolar transistors. It will be evident that equivalent circuits can be realized by means of unipolar transistors.

It is also to be noted that a multivibrator delivering a symmetrical output signal is described in the foregoing examples. The invention can also be realized using an oscillator of the described kind which delivers an asymmetrical output signal. The absolute values of the slope of the positive-going edge and the negative-going edge are then unequal. The reversal of the polarity of the compensation voltage should then be accompanied by an appropriate change of the absolute value of the compensation voltage.

I claim:

1. An oscillator comprising: a capacitance, means for charging and means for discharging the capacitance, feedback means for activating the charging means and discharging means in dependence on an oscillator signal, and an amplifier having an input coupled to said capacitance for amplifying a voltage developed across said capacitance, characterized in that the amplifier comprises a control input for adjusting a phase difference between a zero-crossing of an amplifier output signal and a reference phase in the oscillator signal by means of an offset voltage.

2. An oscillator as claimed in claim 1, further comprising switching means for reversing the polarity of the offset voltage at the amplifier control input under the control of the oscillator signal.

3. An oscillator as claimed in claim 2, further comprising a control loop which comprises a phase difference detector for generating the offset voltage for the amplifier control input as a function of the oscillator signal and the amplifier output signal.

4. An oscillator as claimed in claim 2, wherein the amplifier comprises two parallel current branches, each of which comprises a series connection of a current channel of a transistor, a resistance and a current source, the transistors being controllable in a mutually opposed fashion by the capacitance voltage and at least one of the current sources being controllable via the control input, and wherein inputs of a differential amplifier are coupled to respective nodes between the resistance and the current source in each of said two parallel current branches.

5. An oscillator as claimed in claim 2, wherein the amplifier comprises two parallel current branches, each branch including a series connection of a resistance, a current channel of a transistor and a current source, the transistors being controllable by the capacitance voltage in a mutually opposed fashion, at least one of the current sources being controllable via the control input, and a further resistance coupling a node between the transistor and the current source in one current branch to a node between the transistor and the current source in the other one of said current branches.

6. An oscillator as claimed in claim 1, wherein the amplifier comprises two parallel current branches, each of which includes an asymmetrical differential amplifier transistor pair fed by a current source, said transistor pairs being connected to a power supply terminal via common loads and being controllable by the capacitance voltage, at least one of the current sources being controllable via the control input.

7. An oscillator as claimed in claim 4, wherein said switching means includes a first switch in each of the current branches of the amplifier for interrupting the respective current branch, and first and second crosswise couplings between the current branches with a second switch in each of the couplings, the first switches being controllable by the oscillator signal in an opposed fashion with respect to the second switches.

8. An oscillator as claimed in claim 1, further comprising a control loop which comprises a phase difference detector for generating the offset voltage for the amplifier control input as a function of the oscillator signal and the amplifier output signal.

9. An oscillator as claimed in claim 1, wherein the amplifier comprises two parallel current branches, each of which comprises a series connection of a current channel of a transistor, a resistance and a current source, the transistors being controllable in a mutually opposed fashion by the capacitance voltage and at least one of the current sources being controllable via the control input, and wherein inputs of a differential amplifier are coupled to respective nodes between the resistance and the current source in each of said two parallel current branches.

10. An oscillator as claimed in claim 9, further comprising switching means for reversing the polarity of the offset voltage at the amplifier control input under the control of the oscillator signal, the switching means including a first switch in each of the current branches of the amplifier for interrupting the respective current branch, and first and second cross-wise couplings between the current branches with a second switch in each of the couplings, the first switches being controllable by the oscillator signal in an opposed fashion with respect to the second switches.

11. An oscillator as claimed in claim 1, wherein the amplifier comprises two parallel current branches, each branch including a series connection of a resistance, a current channel of a transistor and a current source, the transistors being controllable by the capacitance voltage in a mutually opposed fashion, at least one of the current sources being controllable via the control input, and a further resistance coupling a node between the transistor and the current source in one current branch to a node between the transistor and the current source in the other one of said current branches.

12. An oscillator as claimed in claim 11, further comprising, switching means for reversing the polarity of the offset voltage at the amplifier control input under the control of the oscillator signal, the switching means including a first switch in each of the current branches of the amplifier for interrupting the respective current branch, and first and second cross-wise couplings between the current branches with a second switch in each of the couplings, the first switches being controllable by the oscillator signal in an opposed fashion with respect to the second switches.

13. An oscillator as claimed in claim 2, wherein the amplifier comprises two parallel current branches, each of which includes an asymmetrical differential amplifier transistor pair fed by a current source, said transistor pairs being connected to a power supply terminal via common loads and being controllable by the capacitance voltage, at least one of the current sources being controllable via the control input.

14. An oscillator as claimed in claim 13, wherein said switching means includes a first switch in each of the current branches of the amplifier for interrupting the respective current branch, and first and second crosswise couplings between the current branches with a second switch in each of the couplings, the first switches being controllable by the oscillator signal in an opposed fashion with respect to the second switches.

15. A phase-controllable oscillator comprising:
first and second cross-coupled inverter circuits having output means,
a capacitance coupled to said first and second inverter circuits,
means including said inverter circuits and coupled to the capacitance for periodically charging and discharging the capacitance thereby to derive a periodic reference voltage across the capacitance and a periodic oscillation signal at said output means of the inverter circuits,
an amplifier having an input coupled to said capacitance and an output for supplying a periodic output signal synchronous to said periodic oscillation signal and with a phase difference therebetween, and
means for applying a compensation voltage to a control input of said amplifier thereby to adjust said phase difference as a function of a zero-crossing of the amplifier output signal and of said capacitance periodic reference voltage.

16. A phase-controllable oscillator as claimed in claim 15 further comprising switching means responsive to said oscillation signal for reversing the polarity of the control input in synchronism with said oscillation signal.

17. A phase-controllable oscillator as claimed in claim 16 wherein said compensation voltage applying means comprises a phase detector responsive to said oscillation signal and to said amplifier output signal for deriving said compensation voltage at an output of the phase detector, said phase detector output being coupled to said amplifier control input.

* * * * *